(12) United States Patent
Itoi et al.

(10) Patent No.: US 11,810,927 B2
(45) Date of Patent: Nov. 7, 2023

(54) SOLID-STATE IMAGING APPARATUS INCLUDING SEMICONDUCTOR ELEMENT WITH PHOTOELECTRIC CONVERTER AND STRAIN SENSORS

(71) Applicant: Panasonic Intellectual Property Management Co., Ltd., Osaka (JP)

(72) Inventors: Kiyokazu Itoi, Osaka (JP); Daisuke Sakurai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 284 days.

(21) Appl. No.: 17/171,917

(22) Filed: Feb. 9, 2021

(65) Prior Publication Data

US 2021/0305293 A1 Sep. 30, 2021

(30) Foreign Application Priority Data

Mar. 24, 2020 (JP) ................................. 2020-052672

(51) Int. Cl.
*H01L 27/146* (2006.01)
*G01L 1/18* (2006.01)

(52) U.S. Cl.
CPC .......... *H01L 27/14603* (2013.01); *G01L 1/18* (2013.01); *H01L 27/14618* (2013.01); *H01L 27/14621* (2013.01); *H01L 27/14627* (2013.01); *H01L 27/14636* (2013.01); *H01L 27/14645* (2013.01)

(58) Field of Classification Search
CPC ......... H01L 27/14603; H01L 27/14627; H01L 27/14621; H01L 27/14645; H01L 27/1464; H01L 27/14625; G01M 5/0041; G01L 1/18
See application file for complete search history.

(56) References Cited

U.S. PATENT DOCUMENTS

| | | | |
|---|---|---|---|
| 6,864,477 B2 * | 3/2005 | Stuetzler | G01J 1/04 250/227 |
| 8,053,856 B1 * | 11/2011 | Tu | H01L 27/1464 257/431 |
| 10,128,291 B2 * | 11/2018 | Yanagita | H01L 27/14621 |
| 11,335,868 B2 * | 5/2022 | Fu | H10K 59/131 |
| 2005/0056903 A1 | 3/2005 | Yamamoto et al. | |

(Continued)

FOREIGN PATENT DOCUMENTS

JP 4722702 B 7/2011

*Primary Examiner* — Mark W Tornow
*Assistant Examiner* — David Paul Sedorook
(74) *Attorney, Agent, or Firm* — Wenderoth, Lind & Ponack, L.L.P.

(57) ABSTRACT

A semiconductor element includes a plurality of microlenses provided on a main surface to collect light, a plurality of conductive electrodes provided on a back surface of the main surface, a photoelectric converter to which the light collected by the plurality of microlenses is guided, and a strain sensor provided on the same layer as the photoelectric converter to detect a strain. A solid-state imaging apparatus includes the semiconductor element, a transparent member, an adhesive layer that covers the plurality of microlenses and adheres to the transparent member, and a plurality of external connection electrodes electrically connected to the plurality of conductive electrodes, respectively.

7 Claims, 5 Drawing Sheets

(56) References Cited

U.S. PATENT DOCUMENTS

| | | | | |
|---|---|---|---|---|
| 2009/0059055 A1* | 3/2009 | Nakano | ............ | H01L 27/14618 |
| | | | | 348/340 |
| 2019/0109168 A1* | 4/2019 | Takeo | ............... | H01L 31/02366 |
| 2020/0075646 A1* | 3/2020 | Onuki | ................. | H01L 27/1463 |
| 2020/0125817 A1* | 4/2020 | Kim | .................... | G06V 40/1306 |
| 2020/0393936 A1* | 12/2020 | Bok | ....................... | H10K 59/40 |
| 2021/0200366 A1* | 7/2021 | Bok | ..................... | H10K 59/122 |

* cited by examiner

FIG. 5

| INSPECTION ITEM | DEFECT ITEM | | | | | | |
|---|---|---|---|---|---|---|---|
| | APPEARANCE | ELECTRICITY (CONDUCTION) | OPTICAL CHARACTERISTICS | IMAGE | DUST | CHARACTERISTICS (LATE-COMING) | IMAGE (LATE-COMING) |
| RELATED ART | ○ | ○ | ○ | ○ | ○ | × | × |
| PRESENT EMBODIMENT | ○ | ○ | ○ | ○ | ○ | ○ | ○ |

SOLID-STATE IMAGING APPARATUS INCLUDING SEMICONDUCTOR ELEMENT WITH PHOTOELECTRIC CONVERTER AND STRAIN SENSORS

BACKGROUND

1. Technical Field

The present disclosure relates to a semiconductor element and a solid-state imaging apparatus.

2. Description of the Related Art

Recently, an electronic component or an electronic device has been miniaturized, highly functional, and diversified, and in order to meet required needs, a density of a semiconductor element has been increased.

For example, a wafer level chip size package (CSP) in which a cover glass is bonded to a semiconductor element via a film, an adhesive, or the like is well known in general as a packaging of a semiconductor element for realizing a high density.

For example, Japanese Patent No. 4722702 discloses a semiconductor package. FIG. 8 is a cross-sectional view of the semiconductor package of Japanese Patent No. 4722702.

A semiconductor package 100 of Japanese Patent No. 4722702 includes semiconductor element 102 on which a circuit element is provided on first surface 101a of semiconductor board 101, external wiring region 110 provided on second surface 101b of semiconductor board 101, support board 104 that is adhered to and fixed by adhesive layer 105 provided on first surface 101a of semiconductor board 101 and is formed of a light-transmitting material, electrode pad 106 arranged on first surface 101a of semiconductor board 101, a through-hole formed in semiconductor board 101 directly under electrode pad 106 such that electrode pad 106 is exposed from second surface 101b of semiconductor board 101, electric insulating film 107 that covers second surface 101b of semiconductor board 101 and an inner surface of the through-hole and is arranged to expose electrode pad 106, through-electrode 108 that is arranged to cover an inner surface of the through-hole and an exposed portion of electrode pad 106 via electric insulating film 107 and is electrically connected to electrode pad 106, external wire 109 for connecting through-electrode 108 to external wiring region 110, a connector for connecting an external terminal to external wiring region 110, and protective film 113 that covers all portions other than the connector on second surface 101b side of semiconductor board 101.

SUMMARY

In a semiconductor package of Japanese Patent No. 4722702, a mechanical stress, a thermal stress, or the like in an assembly process during packaging is concentrated on a support board or an adhesive layer that adheres to and fixes a semiconductor board.

The above-described stress concentration remains as a strain in a semiconductor package even after the semiconductor package is completed, but it is difficult to detect the strain as a defect in an electrical inspection or an optical characteristic inspection to be performed before the semiconductor package is shipped. Therefore, the semiconductor package in which the strain remains is provided to a user as a non-defective product. Thereafter, a late-coming defect such as crack or peeling off occurs at an interface of an adhesive layer or inside semiconductor elements such as a plurality of microlenses under the adhesive layer and a color filter due to a thermal stress generated when a semiconductor package is secondarily mounted on a board or a mechanical stress generated when a module is assembled.

An object of one aspect of the present disclosure is to provide a semiconductor element and a solid-state imaging apparatus capable of detecting a defect that causes a late-coming defect before being provided to a user.

A semiconductor element according to an aspect of the present disclosure includes a plurality of microlenses provided on a main surface to collect light, a plurality of conductive electrodes provided on a back surface of the main surface, a photoelectric converter to which the light collected by the plurality of microlenses is guided, and a strain sensor provided on the same layer as the photoelectric converter to detect a strain.

A solid-state imaging apparatus according to an aspect of the present disclosure includes a semiconductor element according to the aspect of the present disclosure, a transparent member, an adhesive layer that covers the plurality of microlenses and adheres to the transparent member, and a plurality of external connection electrodes electrically connected to the plurality of conductive electrodes, respectively.

According to the present disclosure, it is possible to detect a defect that causes a late-coming defect before being provided to a user.

BRIEF DESCRIPTION OF THE DRAWINGS

FIG. 5 is a table illustrating a comparison between an inspection process of the related art and the inspection process according to the first exemplary embodiment of the present disclosure;

DETAILED DESCRIPTIONS

Figure 1:
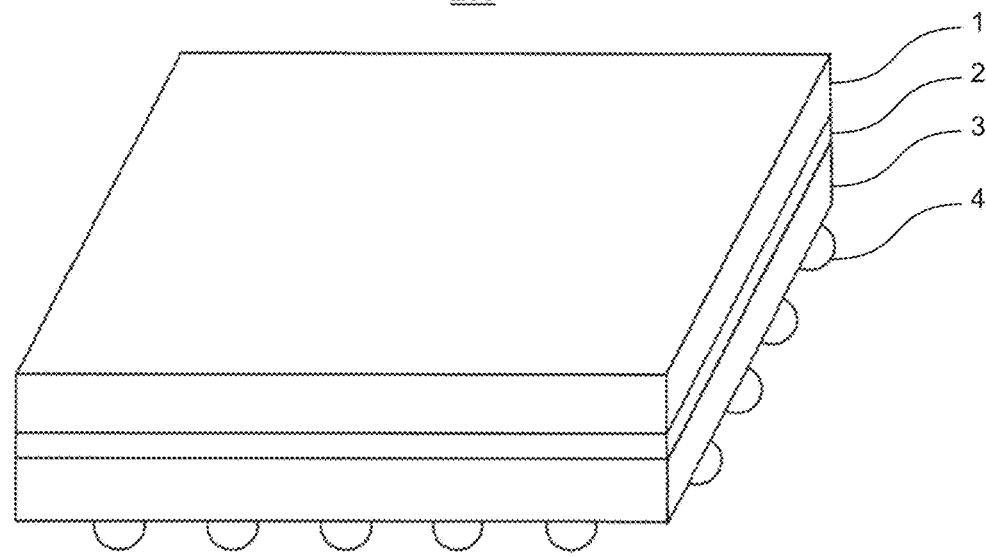
FIG. 1 is a perspective view of a solid-state imaging apparatus according to a first exemplary embodiment of the present disclosure.

Hereinafter, exemplary embodiments of the present disclosure will be described with reference to the drawings. Components common to each figure are denoted by the same reference numerals, and description thereof will be omitted as appropriate.

Further, dimensions (for example, thickness, length, and so on) of the components illustrated in each figure are different from actual dimensions and are configured to be easy to illustrate. Further, the number of each of a plurality of microlenses, a photoelectric converter, and a plurality of external connection electrodes illustrated in each figure is also different from the actual number and is set to be easy to illustrate. Further, materials of each component is not limited to the materials to be described below.

First Exemplary Embodiment

Figure 2:
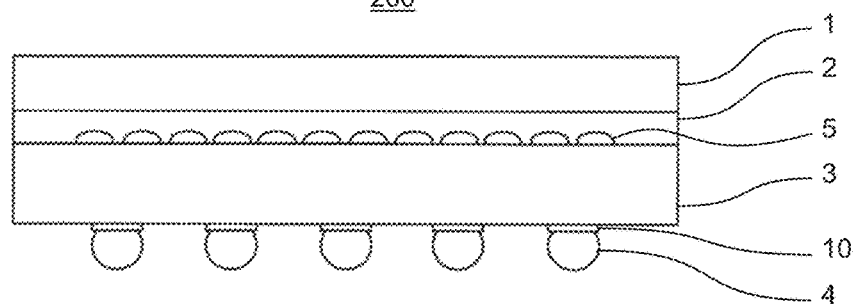
FIG. 2 is a cross-sectional view of the solid-state imaging apparatus according to the first exemplary embodiment of the present disclosure.
Figure 3:
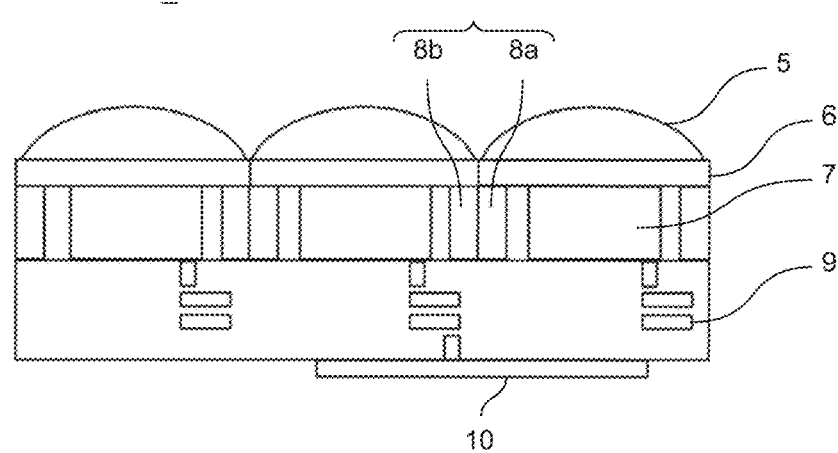
FIG. 3 is a cross-sectional view of a semiconductor element according to the first exemplary embodiment of the present disclosure.

A configuration of solid-state imaging apparatus 200 according to the present exemplary embodiment will be described with reference to FIGS. 1, 2, and 3. FIG. 1 is a perspective view of solid-state imaging apparatus 200. FIG. 2 is a cross-sectional view of solid-state imaging apparatus 200. FIG. 3 is a cross-sectional view of semiconductor element 3 provided in solid-state imaging apparatus 200.

As illustrated in FIGS. 1 and 2, solid-state imaging apparatus 200 includes transparent member 1, adhesive layer 2, semiconductor element 3, and a plurality of external connection electrodes 4.

As illustrated in FIG. 3, semiconductor element 3 includes a plurality of microlenses 5, color filter 6, photoelectric converter 7, strain sensor 8, internal wire 9, and a plurality of conductive electrodes 10.

As illustrated in FIG. 2, a plurality of microlenses 5 are provided on a main surface of semiconductor element 3 (color filter 6 illustrated in FIG. 3). Meanwhile, as illustrated in FIGS. 1 and 2, a plurality of conductive electrodes 10 are provided on a back surface of the main surface of semiconductor element 3. As illustrated in FIG. 2, a plurality of external connection electrodes 4 electrically connected to the plurality of conductive electrodes 10 are provided on the plurality of conductive electrodes 10.

As illustrated in FIG. 2, adhesive layer 2 is provided on the main surface of semiconductor element 3 so as to cover all of microlenses 5. Transparent member 1 adhered to and fixed by adhesive layer 2 is provided on an upper portion of adhesive layer 2.

For example, a borosilicate glass plate may be used as a material of transparent member 1, or a quartz plate or a low-pass filter with birefringent characteristics may be used as the material of transparent member 1 so as to prevent moire due to an interference fringe in a characteristic direction. When the borosilicate glass plate is used, a thickness of transparent member 1 is in a range of, for example, 100 μm to 1000 μm, preferably in the range of 200 μm to 500 μm.

Adhesive layer 2 is an optically transparent adhesive. A material of adhesive layer 2 includes, for example, an acrylic resin, an epoxy resin, a polyimide resin, and the like. Further, adhesive layer 2 is cured by irradiation with ultraviolet rays, heating, or both the irradiation and heating, and has a cured product property of a lower refractive index than the plurality of microlenses 5.

As illustrated in FIG. 2, the plurality of external connection electrodes 4 are provided on surfaces of the plurality of conductive electrodes 10.

As illustrated in FIG. 3, the plurality of conductive electrodes 10 are electrically connected to internal wires 9 provided inside semiconductor element 3. Thus, solid-state imaging apparatus 200 is secondarily mounted on a board (not illustrated, the same applies hereinafter) via the plurality of conductive electrodes 10, furthermore the plurality of external connection electrodes 4, and thereby, semiconductor element 3 and the board are electrically connected to each other. The board is, for example, a circuit board of an electronic device.

The plurality of external connection electrodes 4 may be, for example, solder balls, may be conductive resin balls having surfaces coated with conductive materials, or may be bumps formed by wire bonding. Materials of the solder balls may include solder materials of compositions such as Sn—Ag—Cu type, Sn—Ag—Bi type, Zn—Bi type, and the like, but are not limited to the compositions.

Further, when the solder balls are used as the plurality of external connection electrodes 4, the plurality of external connection electrodes may be adhered to semiconductor element 3 by soldering. When conductive resin balls are used as the plurality of external connection electrodes 4, the plurality of external connection electrodes may be adhered to semiconductor element 3 by a conductive adhesive. Further, for example, the plurality of external connection electrodes 4 may be formed by supplying a solder paste onto the plurality of external connection electrodes 4 by using a screen printing method and reflowing the solder paste.

Further, as illustrated in FIG. 3, photoelectric converter 7 is provided under the plurality of microlenses 5 and color filter 6 inside semiconductor element 3. Photoelectric converter 7 is electrically connected to the plurality of conductive electrodes 10 via internal wires 9. Light incident on a surface of semiconductor element 3 is collected by the plurality of microlenses 5 and is filtered by color filter 6 and hits photoelectric converter 7.

Further, as illustrated in FIG. 3, strain sensor 8 is provided under color filter 6 so as to be adjacent to photoelectric converter 7 at the inside of semiconductor element 3.

Strain sensor 8 is a semiconductor formed by diffusing impurities such as phosphorus or boron in a silicon wafer. Strain sensor 8 includes p-gauge 8a and n-gauge 8b.

Strain sensor 8 calculates a strain from a resistance change rate and a gauge rate based on a change between a voltage value measured when a constant current flows through a gauge and a voltage value measured when an external stress is applied. That is, strain sensor 8 detects a strain by using a piezoresistive effect in which electrical resistance changes when a mechanical stress is applied to the gauge.

Strain sensor 8 is electrically connected to the plurality of conductive electrodes 10 via internal wires 9. Thereby, during an inspection process (strain inspection to be described below) of solid-state imaging apparatus 200, a constant current can flow from the outside of semiconductor element 3 to strain sensor 8 via the plurality of conductive electrodes 10 to measure a voltage value.

Further, not only in the inspection process of solid-state imaging apparatus 200, but also in each process of manufacturing solid-state imaging apparatus 200, a current can flow from the outside of semiconductor element 3 via the plurality of conductive electrodes 10 or a voltage can be measured.

Thus, a strain can be monitored in real time in a predetermined process. For example, during a bonding process of transparent member 1, there is a series of processes such as first coating upper portions of the plurality of microlenses 5 with an adhesive to become adhesive layer 2, and then mounting transparent member 1 on adhesive layer 2, and then performing curing with ultraviolet rays or heat. By using strain sensor 8, a change in strain can be monitored from a change in resistance value during the series of processes described above. Further, it is possible to grasp in which process a maximum strain occurs during manufacturing.

Thus, an interphase relationship between the strain and crack or peeling off phenomenon that causes semiconductor element 3 to be defective is previously grasped, strain data is monitored in real time during manufacturing, and results thereof are fed back to manufacturing equipment, and thereby, solid-state imaging apparatus 200 can be manufactured under appropriate manufacturing conditions.

In contrast to this, in the related art, an inspection process includes an appearance inspection for detecting chipping of a transparent member, appearance defects of a plurality of conductive electrodes, and the like, an electrical inspection (may be called a conduction inspection) for detecting a conduction defect, an electrical characteristic defect, and the like, an optical characteristic inspection for detecting color unevenness, a pixel scratch defect, and the like, an image inspection for perform a sensory inspection on an image of a solid-state imaging apparatus which is actually captured, and a dust inspection for detecting foreign matter and dust on a surface of a transparent member, and thereafter, the solid-state imaging apparatus is packed and shipped. Therefore, although faults can be detected before shipment, a late-coming defect (for example, crack or peeling off) that occur due to secondary mounting of the solid-state imaging apparatus on the board or module assembly performed after shipment could not be detected before shipment.

Figure 4:
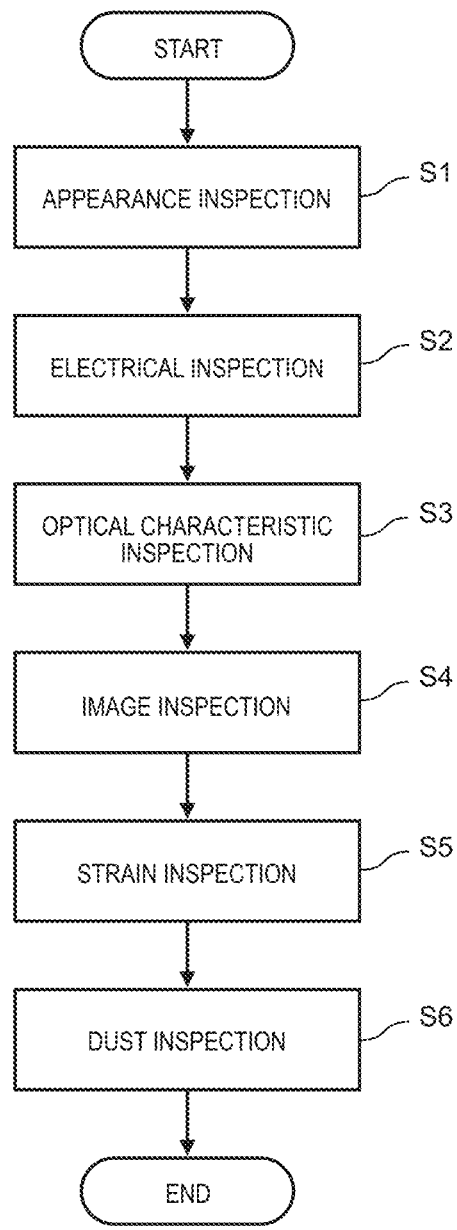
FIG. 4 is a flowchart of an inspection process of the solid-state imaging apparatus according to the first exemplary embodiment of the present disclosure.

FIG. 4 illustrates a flow of an inspection process of solid-state imaging apparatus 200 according to the present exemplary embodiment. FIG. 4 is a flowchart illustrating the flow of the inspection process of solid-state imaging apparatus 200.

First, an appearance inspection is performed (step S1). During this appearance inspection, chipping of transparent member 1, appearance defects of the plurality of conductive electrodes 10, and the like are detected.

Next, an electrical inspection is performed (step S2). During this electrical inspection, a conduction defect, an electrical characteristic defect, and the like are detected.

Next, an optical characteristic inspection is performed (step S3). During this optical characteristic inspection, color unevenness, a pixel scratch defect, and the like are detected.

Next, an image inspection is performed (step S4). During this image inspection, a sensory inspection is performed on an image of solid-state imaging apparatus 200 which is actually captured.

Next, a strain inspection is performed (step S5). During this strain inspection, a strain is detected (specifically, a residual stress in semiconductor element 3 is measured) by using strain sensor 8.

Finally, a dust inspection is performed (step S6). During this dust inspection, foreign matter and dust on a surface of transparent member 1 are detected.

Solid-state imaging apparatus 200 that passes the inspections in step S1 to step S6 is packed and shipped.

As described above, the inspection process of solid-state imaging apparatus 200 differs from the inspection process of the related art in that the strain inspection of step S5 is added.

FIG. 5 illustrates a comparison between the inspection process of the related art and the inspection process according to the present exemplary embodiment. In FIG. 5, a circle mark indicates that a defective item can be detected, and a cross mark indicates that a defective item cannot be detected.

In the inspection process according to the present exemplary embodiment, it is possible to detect a product in which a late-coming defect such as a late-coming image defect, a late-coming image strain, or the like can occur.

The late-coming image defect is scratch and the like of a pixel caused by peeling off of a plurality of microlenses, a color filter, and an adhesive layer caused by a stress of a post-shipment process (for example, during secondary mounting, during module assembly, or the like). Further, the late-coming image strain is a strain and the like of an image caused by strains of the plurality of microlenses and the adhesive layer itself caused by a stress of the post-shipment process.

The characteristics (late-coming) illustrated in FIG. 5 is a decrease in light reception sensitivity, spectral characteristics, or the like. Further, the image (late-coming) illustrated in FIG. 5 is a general term including the late-coming image defect and the late-coming image strain described above.

Usually, a residual stress before shipment and a stress generated in the process after shipment cause the peeling off and strain, and thereby, a late-coming defect occurs. In contrast to this, in the inspection process of the present exemplary embodiment, the residual stress in semiconductor element 3 which is not shipped can be detected. Thus, by previously investigating an interphase relationship between the residual stress before shipment, a stress generated in the post-shipment process, and occurrence of a late-coming defect, and detecting the residual stress before shipment in the process of the present exemplary embodiment, it is possible to detect a product that may cause the late-coming defect.

Second Exemplary Embodiment

Figure 6:
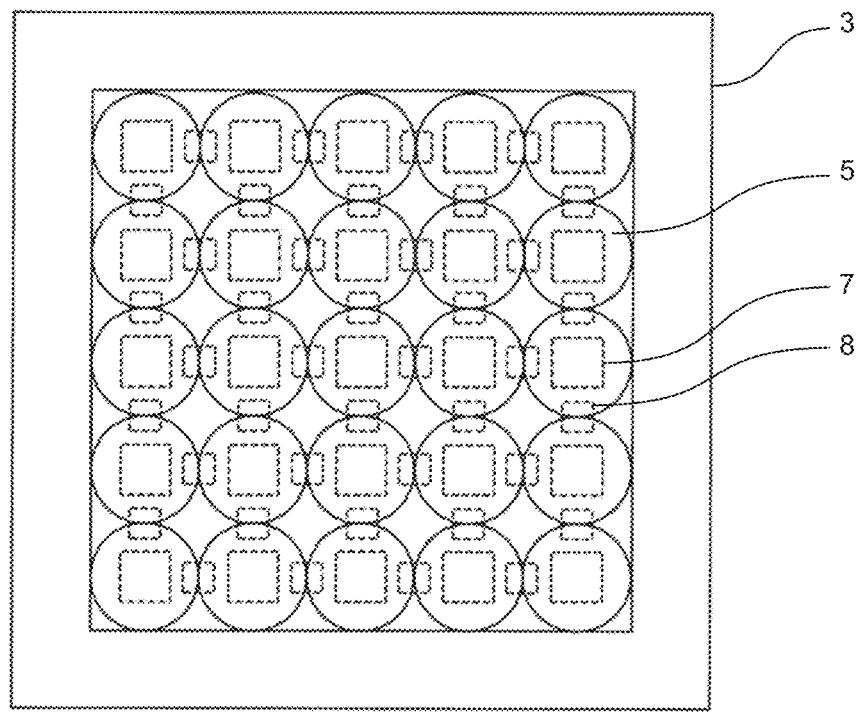
FIG. 6 is a plan view of a semiconductor element according to a second exemplary embodiment of the present disclosure.

A configuration of semiconductor element 3 according to the present exemplary embodiment will be described with reference to FIG. 6. FIG. 6 is a plan view of semiconductor element 3 according to the present exemplary embodiment when viewed from transparent member 1 side (in other words, a main surface side).

As illustrated in FIG. 6, a plurality of microlenses 5 are arranged in a grid shape on a main surface of semiconductor element 3. Photoelectric converter 7 is provided directly under each of the microlenses 5. Thereby, a path of light incident on the plurality of microlenses 5 from the outside is changed by the plurality of microlenses 5, and more light is collected in photoelectric converter 7.

Here, in order to improve sensitivity characteristics of a solid-state imaging apparatus, it is important that the light emitted from the plurality of microlenses 5 reaches photoelectric converter 7 without being blocked. Thus, strain sensor 8 needs to be provided at a position that does not affect the path of light.

Strain detected by strain sensor 8 is mainly due to a mechanical stress or a thermal stress of adhesive layer 2 that covers each of the microlenses 5 and adheres to and fixes transparent member 1. Thus, a main defect occurrence location is an interface between adhesive layer 2 and the plurality of microlenses 5, or an interface between the plurality of microlenses 5 and color filter 6 under the plurality of microlenses 5.

Further, the plurality of microlenses 5 are often made of a material with low elasticity that easily absorbs a stress. Therefore, the above-described stress is easy to be concentrated between the plurality of adjacent microlenses 5.

From a viewpoint of the path of light and stress concentration described above, when semiconductor element 3 is viewed from transparent member 1 side in a plan view, strain sensor 8 is arranged directly under a boundary portion (may be referred to as a contact portion of a plurality of adjacent microlenses 5) of a plurality of adjacent microlenses 5 and between adjacent photoelectric converters 7 (hereinafter referred to as between photoelectric converters), in semiconductor element 3 according to the present exemplary embodiment, as illustrated in FIG. 6.

FIG. 6 illustrates a case in which strain sensors 8 are arranged between all the photoelectric converters as an example, but the present disclosure is not limited thereto. For example, strain sensor 8 may be arranged only between the photoelectric converters which are assumed to be susceptible to stress in particular. Alternatively, for example, when it is desirable to grasp a strain tendency of entire semiconductor element 3, strain sensor 8 may be arranged only between the photoelectric converters located in the center of a main surface of semiconductor element 3 and the photoelectric converters located on an outer circumference side or a corner side of the main surface of semiconductor element 3.

Semiconductor element 3 of FIG. 6 configured as described above is provided in solid-state imaging apparatus 200 illustrated in FIGS. 1 and 2.

Third Exemplary Embodiment

Figure 7:
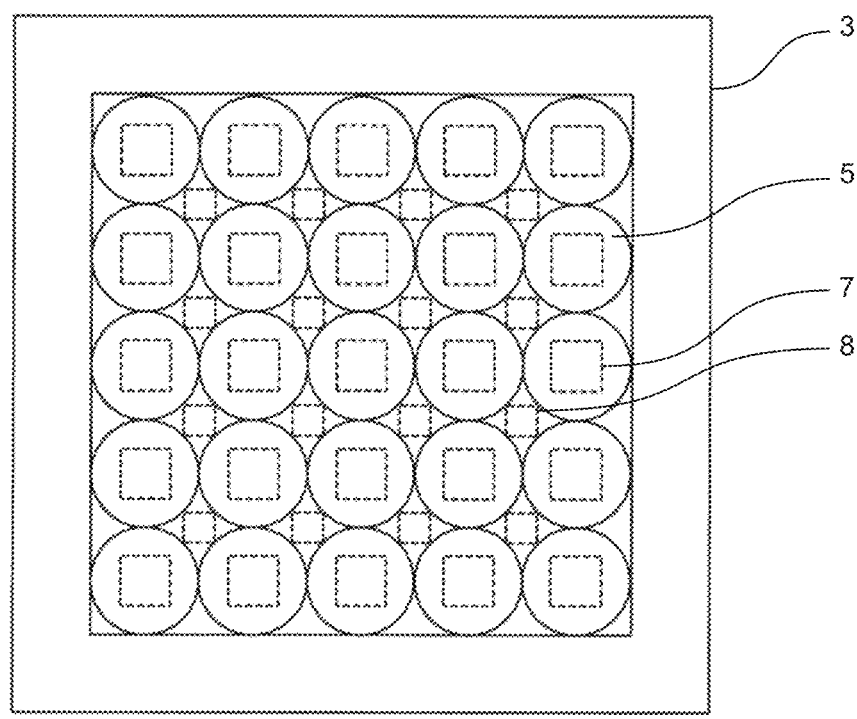
FIG. 7 is a plan view of a semiconductor element according to the third exemplary embodiment of the present disclosure.
Figure 8:
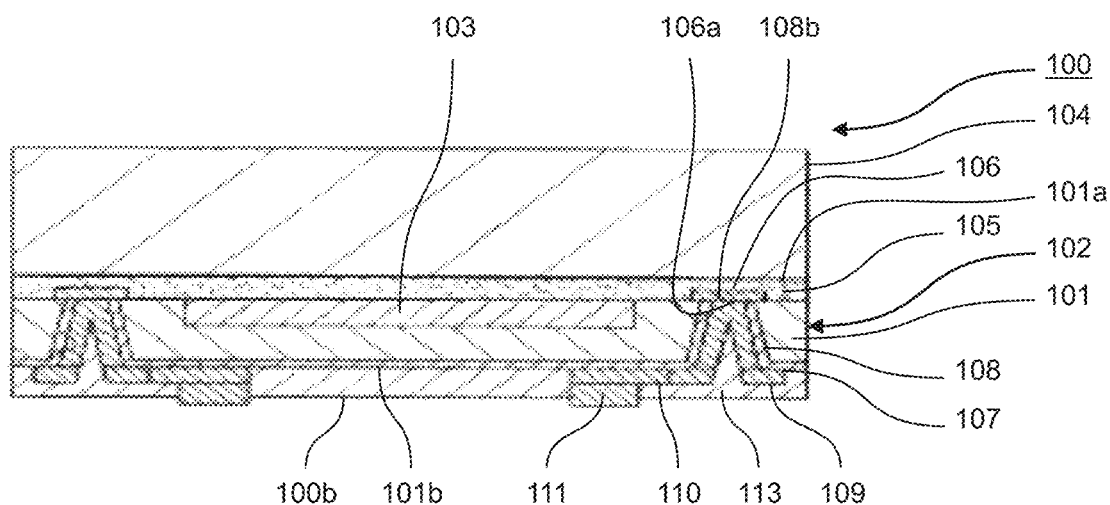
FIG. 8 is a cross-sectional view of a semiconductor package of Japanese Patent No. 4722702.

A configuration of semiconductor element 3 according to the present exemplary embodiment will be described with reference to FIG. 7. FIG. 7 is a plan view of semiconductor element 3 according to the present exemplary embodiment when viewed from transparent member 1 side (in other words, a main surface side).

As illustrated in FIG. 7, arrangement positions of the plurality of microlenses 5 and photoelectric converters 7 are the same as illustrated in FIG. 6. That is, a plurality of microlenses 5 are arranged in a grid shape on a main surface of semiconductor element 3, and photoelectric converters 7 are provided directly under the respective microlenses 5.

As illustrated in FIG. 7, the plurality of microlenses 5 have a circular shape when semiconductor element 3 is viewed from transparent member 1 side. When semiconductor element 3 is viewed from transparent member 1 side in a plan view, a stress is easily concentrated in a region surrounded by outer edges of four adjacent microlenses 5. Since this region can be referred to as a region in which the plurality of microlenses 5 are not arranged, this region is hereinafter referred to as a "microlens non-arrangement region".

From a viewpoint of the stress concentration described above, strain sensor 8 is arranged directly under the microlens non-arrangement region (more specifically, directly under a central portion of a plurality of microlens non-arrangement regions) and between photoelectric converters 7 adjacent to each other in an oblique direction, in semiconductor element 3 according to the present exemplary embodiment.

FIG. 7 illustrates a case in which strain sensors 8 are arranged in all the plurality of microlens non-arrangement regions as an example, but the present disclosure is not limited thereto. For example, strain sensor 8 may be arranged only in the microlens non-arranged region where stress is expected to be particularly likely to be applied. Alternatively, for example, strain sensors 8 may be arranged only in the plurality of microlens non-arrangement regions located in the center of a main surface of semiconductor element 3 and in the plurality of microlens non-arrangement regions located on an outer circumference side or a corner side of the main surface of semiconductor element 3. Alternatively, for example, strain sensors 8 may be arranged at equal intervals in all region where the plurality of microlenses 5 are arranged. Further, for example, when it is desirable to measure a strain for development purposes and the like, a plurality of microlens non-arrangement regions to be measured may be randomly selected, and strain sensors 8 may be arranged only in the plurality of microlens non-arrangement regions.

Semiconductor element 3 of FIG. 7 configured as described above is provided in solid-state imaging apparatus 200 illustrated in FIGS. 1 and 2.

As described above, it is characterized in that semiconductor element 3 according to the present exemplary embodiment includes a plurality of microlenses 5 that are provided on a main surface and collect light, a plurality of conductive electrodes 10 provided on a back surface of the main surface, photoelectric converters 7 to which the light collected by the plurality of microlenses 5 is guided, and strain sensors 8 that are provided in the same layer as photoelectric converters 7 and detect a strain.

Further, it is characterized in that solid-state imaging apparatus 200 according to the present exemplary embodiment includes semiconductor element 3 according to the present exemplary embodiment, transparent member 1, adhesive layer 2 that covers the plurality of microlenses 5 and adheres to transparent member 1, and a plurality of external connection electrodes 4 electrically connected to the plurality of conductive electrodes 10, respectively.

Semiconductor element 3 and solid-state imaging apparatus 200 according to the present exemplary embodiment may detect a defect (strain) that causes a late-coming defect (occurs in a secondary mounting process or module assembly process) before being provided to a user with the above-described characteristics.

The present disclosure is not limited to the description of each of the above-described exemplary embodiments, and various modifications can be made without departing from the ideal of the present disclosure.

A semiconductor element and a solid-state imaging apparatus according to the present disclosure can previously detect a late-coming defect which cannot be detected by an inspection process of the related art and can occur after being provided to a user, and is useful in a semiconductor element and a solid-state imaging apparatus which are miniaturized and highly functional.

What is claimed is:

1. A semiconductor element comprising:
   a plurality of microlenses provided on an upper surface of a main layer to collect light;
   a plurality of conductive electrodes provided on a lower surface of the main layer;
   at least one photoelectric converter to which the light collected by the plurality of microlenses is guided provided in the main layer;
   a strain sensor electrically connected to the plurality of conductive electrodes via internal wiring and provided in the main layer with the photoelectric converter, the strain sensor being configured to detect a strain using a piezoresistive effect in which electrical resistance changes when a mechanical stress is applied; and
   a color filter provided in the main layer and between the plurality of microlenses and the photoelectric converter to filter the light collected by the plurality of microlenses.

2. The semiconductor element of claim 1,
   wherein each photoelectric converter is provided to correspond to a position of each of the plurality of microlenses, and
   the strain sensor is arranged between the photoelectric converters adjacent to each other.

3. The semiconductor element of claim 2,
   wherein, when the semiconductor element is viewed from a main layer side in a plan view,
   the plurality of microlenses are arranged in a grid shape, and the strain sensor is arranged directly under a boundary portion of the plurality of microlenses adjacent to each other.

4. The semiconductor element of claim 2,
wherein, when the semiconductor element is viewed from a main layer side in a plan view,
the plurality of microlenses are arranged in a grid shape, and
the strain sensor is arranged directly under a region where the plurality of microlenses are not arranged.

5. A solid-state imaging apparatus comprising:
the semiconductor element of claim 1;
a transparent member;
an adhesive layer that covers the plurality of microlenses and adheres to the transparent member; and
a plurality of external connection electrodes electrically connected to the plurality of conductive electrodes, respectively.

6. The semiconductor element of claim 1, wherein the strain sensor is arranged directly under a boundary portion of two adjacent microlenses of the plurality of microlenses.

7. The semiconductor element of claim 6, wherein
the strain sensor includes a first gauge and a second gauge,
the first gauge is arranged directly under one microlens of the two adjacent microlenses, and
the second gauge is arranged directly under another microlens of the two adjacent microlenses.

\* \* \* \* \*